United States Patent [19]

Usagawa et al.

[11] Patent Number: 4,710,787
[45] Date of Patent: Dec. 1, 1987

[54] SEMICONDUCTOR DEVICE

[75] Inventors: Toshiyuki Usagawa, Kokubunji; Yuichi Ono; Susumu Takahashi, both of Nishitama, all of Japan

[73] Assignee: Hitachi, Ltd., Tokyo, Japan

[21] Appl. No.: 686,691

[22] Filed: Dec. 27, 1984

[30] Foreign Application Priority Data

Dec. 28, 1983 [JP] Japan ................... 58-246279

[51] Int. Cl.$^4$ ............... H01L 29/161; H01L 29/74; H01L 29/12; H01L 29/06
[52] U.S. Cl. ...................... 357/16; 357/22; 357/58; 357/56
[58] Field of Search .............. 357/16, 22, 58, 56

[56] References Cited

U.S. PATENT DOCUMENTS

| | | | |
|---|---|---|---|
| 4,141,021 | 2/1979 | Decker | 357/22 |
| 4,424,525 | 1/1984 | Mimura | 357/22 |
| 4,455,564 | 6/1984 | Delagebeaudeuf et al. | 357/22 MD |

OTHER PUBLICATIONS

Luryi et al., "Unipolar Transistor Based on Charge Injection", 1983, IEEE IEDM Late News Paper #5.8, Presented Dec. 5, 1983, with notes taken by Examiner Larkins.

Primary Examiner—Andrew J. James
Assistant Examiner—Robert P. Limanek
Attorney, Agent, or Firm—Antonelli, Terry & Wands

[57] ABSTRACT

A semiconductor device is provided comprising a control electrode for forming carriers at a junction interface between first and second layers of different materials and for controlling the carriers, a first electrode which is electronically connected to the carriers, and a second electrode region for taking out the carriers in a direction perpendicular to the junction interface. Since the two-dimensional carriers are caused to flow as a current in the direction perpendicular to a plane on which the carriers exist, a great current can be derived as an operating current.

9 Claims, 27 Drawing Figures

SEMICONDUCTOR DEVICE

BACKGROUND OF THE INVENTION

1. Field of the Invention

The present invention relates to an ultraspeed transistor, and more particularly to a new type transistor which has a high drivability and which is well suited for a high degree of packaging.

2. Description of the Prior Art

As transistors which realize high densities of integration on Si substrates, the two major types of a bipolar transistor and a MOS (Metal-Oxide-Semiconductor) type field effect transistor [MOSFET] have heretofore been typical in view of the operating principles. When the bipolar transistor is defined as a vertical device which utilizes the physical phenomena of the diffusion and drift of minority carriers, the field effect transistor is a lateral device which utilizes the drive of majority carriers by an electric field.

In recent years, on account of the limitations of physical constants inherent in Si, ultraspeed devices employing compound semiconductors, principally, gallium-arsenic (GaAs) have been under development without altering the essential mechanisms of transistor operations.

Among them, a hetero-bipolar transistor (in, for example, the official gazette of Japanese Laid-open Patent Application No. 49-43583) and a selectively doped heterojunction type field effect transistor (in, for example, the official gazette of Japanese Laid-open Patent Application No. 56-94779) are mentioned as transistors which employ heterojunctions. From the viewpoint of the operating principle, the latter transistor is almost the same as the MOSFET. Meanwhile, in such transistors employing compounds, the essential portions of transistor operations do not differ from those of the devices employing Si, so that disadvantages innate in the bipolar transistor and the field effect transistor (hereinbelow, termed "FET") respectively remain unsolved.

More specifically, in case of the hetero-bipolar transistor, there is the disadvantage that the density of integration does not become as high as in the FET because an isolation region must be secured. In case of the bipolar transistor, there is the lower limit of the thickness of a base layer because of a restriction in the operating principle.

On the other hand, the field effect transistors are well suited for high integration, but the common disadvantage has been the problem that a great current cannot be taken out.

SUMMARY OF THE INVENTION

An object of the present invention is to provide an ultraspeed transistor suited for high integration which is based on a new principle characterized by causing two-dimensional carriers to flow in a direction perpendicular to a surface where the carriers exist.

Figure 1:
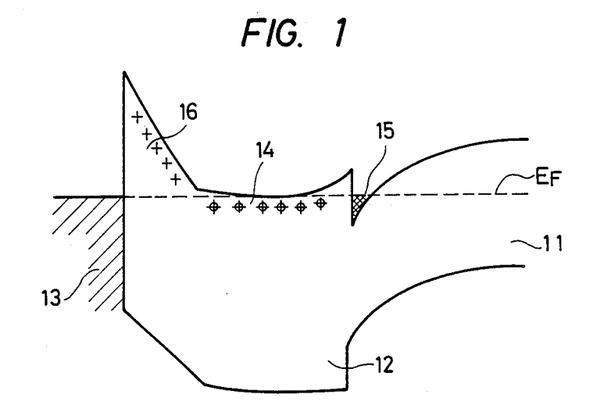
FIG. 1 and FIG. 2 are an energy band diagram and a sectional structural view of a prior-art FET, respectively.
Figure 2:
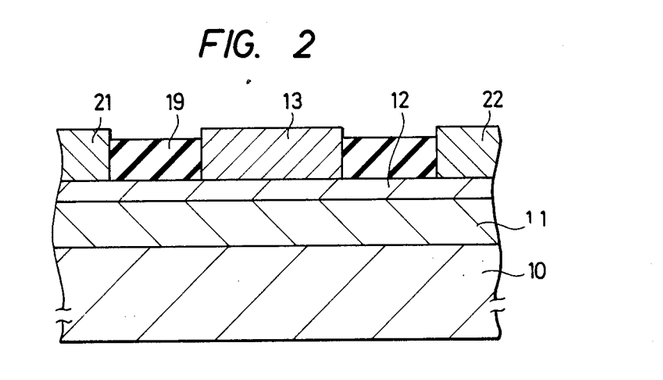

FIG. 1 shows an energy band gap structure for explaining the operating principle of a prior-art FET of the selectively doped heterojunction type. Similarly, FIG. 2 shows the sectional structure of this FET. Using the molecular beam epitaxy (MBE) process ordinarily, a GaAs layer 11 which is approximately 1 μm thick and which is not intentionally doped with any impurity (usually, when the MBE is applied, the layer becomes a weak p⁻-type having an impurity concentration of at most $10^{15}$ cm$^{-3}$) is grown on a semi-insulating GaAs substrate 10. Subsequently, an Al$_x$Ga$_{1-x}$As (x~0.3) layer 12 which contains approximately $1 \times 10^{18}$cm$^{-3}$ of Si is grown to a thickness of about 500 Å. Thereafter, source and drain electrodes 21, 22 and a gate electrode 13 are formed.

Shown in FIG. 1 is the energy band diagram directly under the gate electrode of the semiconductor device. Si atoms introduced by doping are designated at numeral 14, and a depletion layer based on a Schottky contact is designated at numeral 16. Since AlGaAs and GaAs have crystal lattices of the same kind and have very close lattice constants, the number of interfacial levels at a heterojunction interface is thought to be very small. GaAs is greater in the electron affinity than Al$_x$Ga$_{1-x}$As (x~0.3). Therefore, a potential barrier based on the difference of the electron affinities appears at the heterojunction interface, and carriers in two dimensions 15 are formed.

The prior-art FET is characterized by causing the two-dimensional carriers to flow along the heterojunction interface, and it has accordingly been impossible to derive a great current therefrom.

The present invention overcomes the disadvantages of the prior-art FET of the selectively doped heterojunction type and the hetero-bipolar transistor by introducing a new transistor principle characterized in that the two-dimensional carriers 15 existing at the heterojunction interface shown in FIG. 1 are taken out to the side of the GaAs layer 11, namely, that they are taken out as current in a direction perpendicular to the heterojunction interface, and that the creation and extinction of the two-dimensional carriers are controlled by a gate voltage, whereby the magnitude of the current is modulated to execute a transistor operation.

The fundamental construction of the present invention is summarized as follows.

A semiconductor device comprises, at least, first and second layers of different materials which can form carriers at their junction interface, a control electrode which serves to control the carriers, a first electrode which is electronically connected with the carriers, and an electrode region which serves to take out the carriers in a direction perpendicular to the plane of the junction interface.

In general, semiconductor materials which define a heterojunction are used as the different materials of the first and second layers. In addition, the electron affinity of the first semiconductor layer is selected to be smaller than that of the second semiconductor layer. Accordingly, carriers are induced in the second semiconductor layer at its interface with the first semiconductor layer. A forbidden band width is selected to be greater in the first semiconductor layer than in the second semiconductor layer. As a result, the sum between the electron affinity and band gap of the first semiconductor layer is usually rendered greater than that of the second semiconductor layer.

Regarding conductivity types, a typical construction is such that the first semiconductor layer is a p-type layer of a non-doped layer which is not intentionally doped with any impurity, that the second semiconductor layer is an n-type layer or a non-doped layer which is not intentionally doped with any impurity, and that the third semiconductor layer is a p-type layer.

As the third semiconductor layer, an impurity region may be formed within a semi-insulating semiconductor substrate, or an impurity region may well be provided within a semiconductor substrate identical in the conductivity type to the second semiconductor layer.

Of course, transistors of both the enhancement type and the depletion type can be fabricated by applying the principle of the present invention. The types can be regulated according to the distance between the gate electrode and the heterojunction interface forming a channel, or the respective impurity concentrations and thicknesses of the first, second and third semiconductor layers.

DETAILED DESCRIPTION OF PREFERRED EMBODIMENTS

First, the operating principle of a new type transistor according to the present invention will be explained with reference to a sectional view [FIG. 3] and an energy band diagram [FIG. 4] of the element, concerning the transistor of the present invention fabricated by employing a heterojunction defined between p-type GaAs and n-type $Al_xGa_{1-x}As$. Thereafter, operating characteristics in the cases of applying external potentials will be explained.

Figure 3:
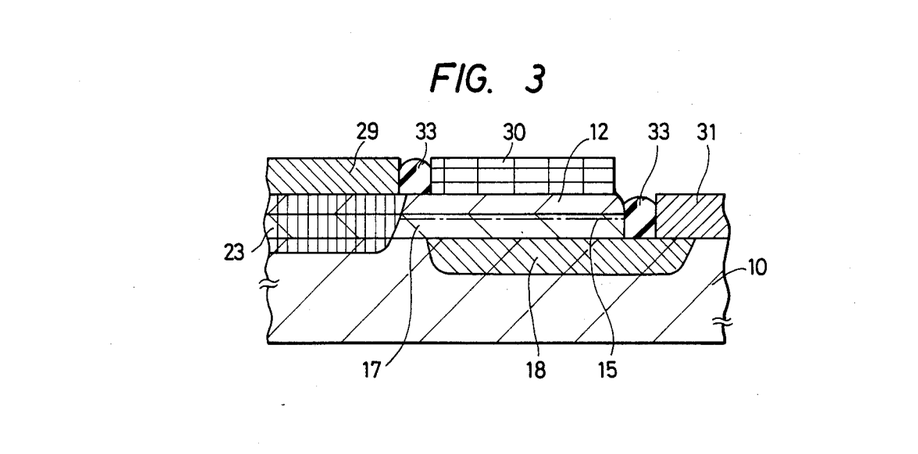
FIG. 3 and FIG. 4 are a sectional view of a transistor according to the present invention and an energy band diagram under a gate electrode thereof, respectively.

As shown in FIG. 3, a p-type GaAs layer 17 which is about 200 Å to 1000 Å thick and an n-type $Al_xGa_{1-x}As$ ($x \sim 0.3$ or so) layer 12 which defines a heterojunction with the layer 17 and which is about 300 Å to 1000 Å thick are formed on a predetermined semiconductor substrate 10. On account of the difference of electron affinities, free electrons in $Al_xGa_{1-x}As$ layer are accumulated on a heterojunction interface on the side of the p-type GaAs layer 17, to form an electron gas layer 15 in two dimensions. FIG. 4 shows a band structure diagram illustrative of this state. In FIG. 4, the same parts as in FIG. 3 are indicated by identical symbols.

Figure 4:
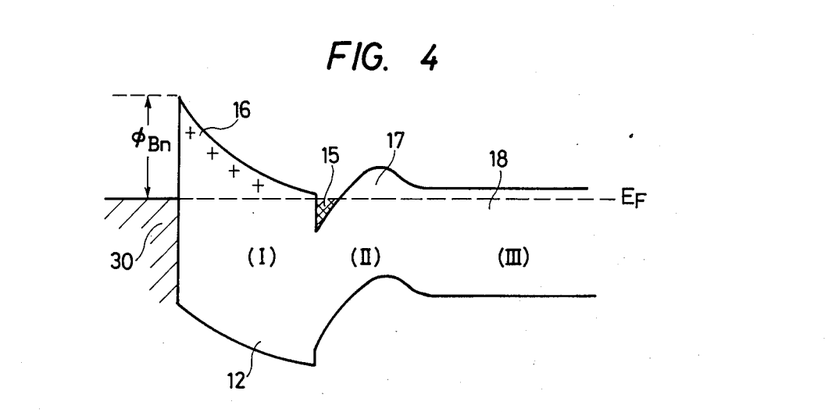

Parts indicated by (I), (II) and (III) in FIG. 4 correspond to the layer 12, the layer 17 and a layer 18, respectively.

The transistor of the present invention has a fundamental structure comprising a source electrode 29 which lies in ohmic contact with the two-dimensional carriers 15 through a layer 23 in a conventional manner, and a gate control electrode 30 which creates or extinguishes the carriers 15, and further the third semiconductor region 18 which is located directly under the control electrode 30 as well as the two-dimensional carriers 15 [in the present case, an n+ GaAs layer having a thickness of about 5000 Å], and a drain electrode 31 which lies in ohmic contact therewith.

The essential feature of the transistor operation consists in that the two-dimensional carriers 15 are taken out as current to the n+layer 18 located vertically below, and that the concentration of the two-dimensional carriers is changed by applying an external potential to the gate electrode 30, whereby the current in the vertical direction is controlled to execute the transistor operation.

Shown in FIG. 4 is the energy band diagram directly under the gate electrode in the case of applying no external potential. Symbol $E_F$ indicates the position of the Fermi energy, and symbol $\phi_{Bn}$ denotes the Schottky potential between the gate electrode metal 30 and the $Al_xGa_{1-x}As$ layer 12. Owing to a phenomenon called the pinning of the Fermi level, the value of $\phi_{Bn}$ is considered to hardly change irrespective of the value of the gate voltage. Donor ions in a depletion layer under the gate electrode are indicated by numeral 16.

Figure 5A:
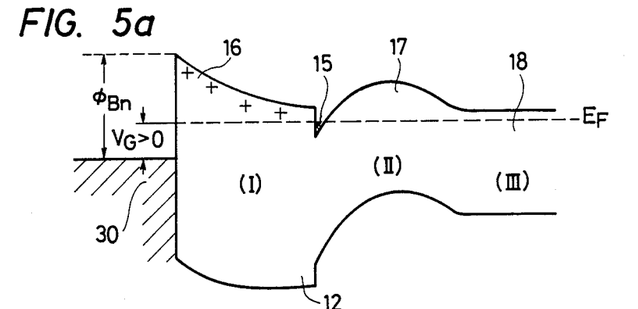
FIGS. 5a–5c and FIG. 6 are energy band diagrams at the times at which external potentials are applied.

Now, the transistor operations in the cases of applying external potentials will be described more in detail with reference to energy band diagrams shown in FIGS. 5a, 5b and 5c and FIG. 6. Shown in FIG. 5a is the energy band diagram at the time at which the source electrode is grounded to equalize the potentials of a source and a drain, whereupon a gate potential $V_G$ positive with respect to the source electrode is applied. In FIG. 5a, the two-dimensional carriers 15 at a concentration according to the value of the certain positive gate voltage $V_G$ are created. Since the source and the drain are at the same potential, no source-drain current flows in this case. It is the same as in the conventional FET that a case where the two-dimensional carriers are, in effect, existent at $V_G=0$ is called the depletion type (D-type), while a case where the two-dimensional carriers 15 are induced for the first time after applying a certain positive gate potential is called the enhancement type (E-type). In addition, the threshold potentials of the E-type and D-type are determined by the impurity concentrations and thicknesses of the respective semiconductor layers (I), (II) and (III). Hereinafter, the layer (II) shall be termed "passage layer".

Figure 5B:
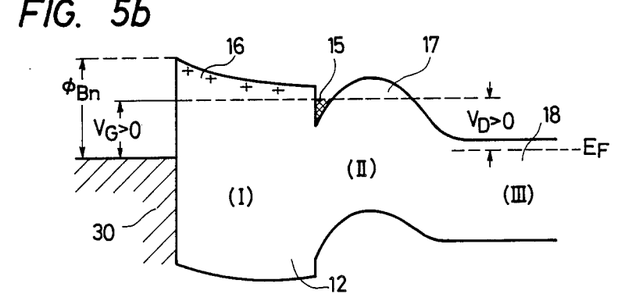
Figure 5C:
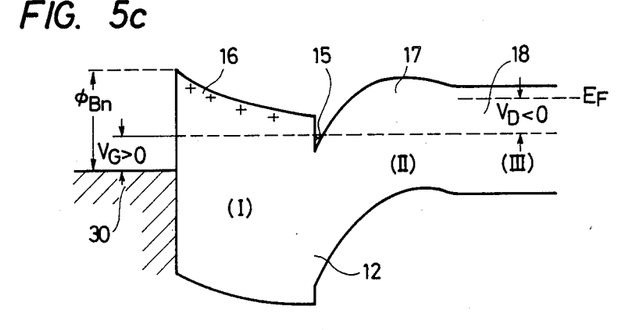

Next, reference is had to the energy band diagrams in the cases where, besides the state of FIG. 5a, a positive drain voltage $V_D$ with respect to the source potential is applied [FIG. 5b] and a negative drain voltage $V_D$ is applied [FIG. 5c]. In the state of FIG. 5b, the two-dimensional carriers 15 and free electron carriers in the semiconductor (III) can be taken out as the current between the source and the drain by the effects of diffusion, drift and tunneling. Which of the above three effects predominates is principally determined by the acceptor concentration and thickness of the semiconductor layer (II). In the state of FIG. 5c, the device is turned off.

Figure 6:
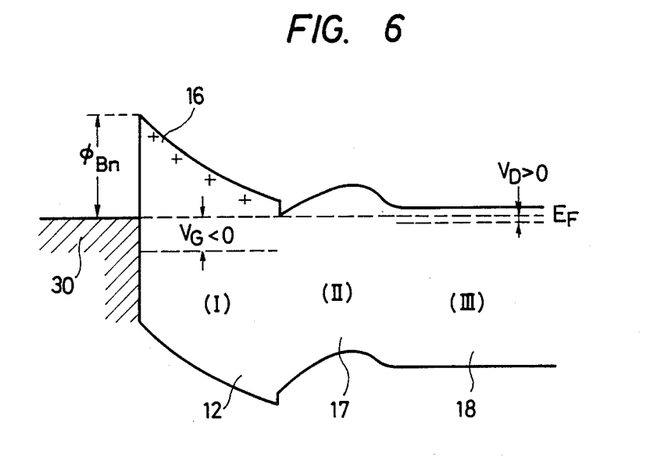

Next, shown in FIG. 6 is the energy band diagram in the case where a negative gate potential $V_G$ is applied to extinguish the two-dimensional carriers. In this case, even when a drain voltage $V_D$ is applied, substantially no current flows (except for a breakdown current at the application of a great voltage $V_D$).

The fact that the transistor can have a great current derived therefrom, will be outlined by comparing this transistor with the selectively-doped heterojunction type FET. Letting $L_g$ denote the gate length, and a denote the thickness of the two-dimensional carriers, the current which is $L_g/a$ times greater can be taken out. When a is estimated to be 100 Å, the current is about 100 times greater because $L_g$ is 1 μm or so.

On the other hand, when compared with the bipolar transistor, the transistor of the invention has the important merit that the transistor operation is executed if the thickness of the p-type semiconductor layer 17 is greater than the thickness a of the two-dimensional carriers. Thus, the restriction which is imposed on the thickness of the base layer is greatly alleviated.

Figure 7A:
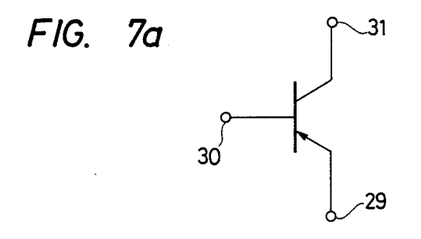
FIGS. 7a–7c are diagrams for explaining the symbols of the transistor of the present invention.
Figure 7B:
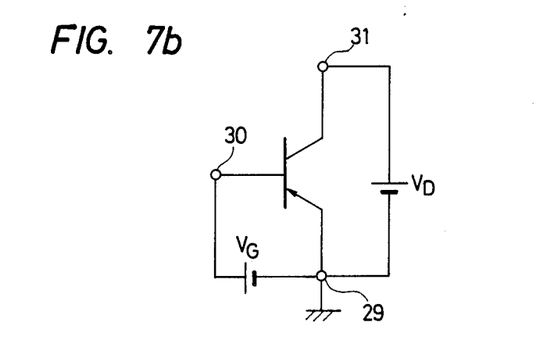
Figure 7C:
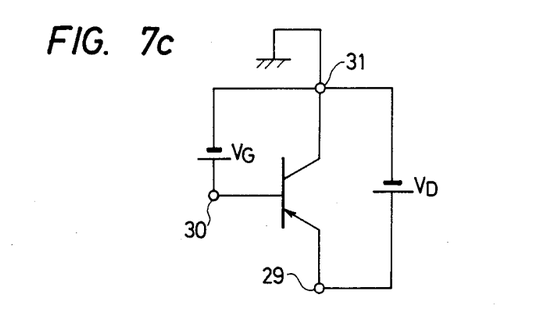

The symbols of this transistor are indicated in FIG. 7a. Numeral 30 denotes a gate electrode terminal, numeral 29 a source electrode terminal, and numeral 31 a drain electrode terminal. The transistor operations explained with reference to FIGS. 5a–5c and FIG. 6 correspond to the case of a grounded source electrode in FIG. 7b. A device can of course be fabricated by connecting a drain electrode as in FIG. 7c.

In the above description of the transistor operations of the present invention, the two-dimensional carriers to be stored on the heterojunction interface have been electrons. The transistor of the present invention can also be fabricated by utilizing positive holes in two dimensions on the basis of the selection of materials for the heterojunction.

Figure 8:
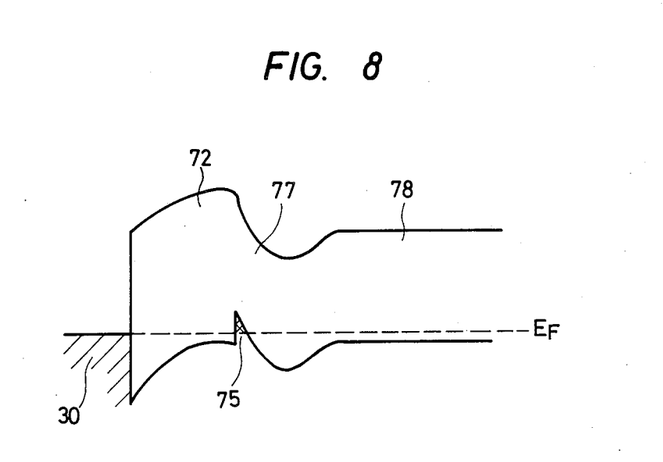
FIG. 8 is an energy band diagram concerning the transistor of the present invention in the case of utilizing two-dimensional positive holes.

FIG. 8 shows an energy band diagram in the case of a three-layer structure which consists of a p-type $CaAs_{1-x}P_x$ layer 72, an n-type GaAs layer 77 and a p-type GaAs layer 78, a gate electrode 30 being arranged in Schottky contact with the $GaAs_{1-x}P_x$ layer. Although there is the difference that source and drain electrodes are led out from the p-type semiconductors, not from n-type semiconductors, the transistor of the present invention can be fabricated using the two-dimensional holes.

In the above description, the $Al_xGa_{1-x}As/GaAs$ system has been referred to.

Needless to say, however, the present invention is effective with other heterojunctions which meet the condition that the electron gas or positive hole gas in two dimensions can be stored.

Such systems are, for example, InP-InGaAsP, $Al_yGa_{1-y}As-Al_xGa_{1-x}As$, GaAs-AlGaAsP, InP-InGaAs, InAs-GaAsSb, $Al_xGa_{1-x}As$-Ge, GaAs-Ge, CdTe-InSb, and GaSb-InAs.

The effects of the present invention can be summarized as follows:

(1) Two dimensional carriers generated at a heterojunction interface are taken out as current in a direction perpendicular to the interface. Therefore, when compared with the prior-art selectively-doped heterojunction FET having substantially equal dimensions, the device of the present invention makes it possible to derive current which is about $L_g/a$ times greater where a denotes the thickness of the two-dimensional carriers and $L_g$ the gate length. At $L_g=1$ μm, current which was about 20 times greater could be obtained.

(2) A passage layer through which the two-dimensional carriers pass in the perpendicular direction can be thinned, in principle, to the thickness of the two-dimensional carriers or so. Therefore, when compared with the bipolar transistor of the same area, the device of the present invention can afford a performance which is 4–100 times higher.

(3) The device of the present invention need not secure an isolation region unlike the case of the bipolar transistor, and is therefore capable of high integration similar to that of the selectively-doped heterojunction type FET.

(4) When a third semiconductor layer of the n-type or the p-type is selectively formed in a third semiconductor substrate which is semi-insulating, the invention is effective to mitigate the restriction in which a margin in the design of a transistor is determined by the condition that depletion layers extending from both a source region and a drain region do not overlap.

EXAMPLE 1

FIGS. 9a–9d show the principle steps of the manufacture of a semiconductor device which utilizes a two-dimensional electron gas.

Figure 9A:
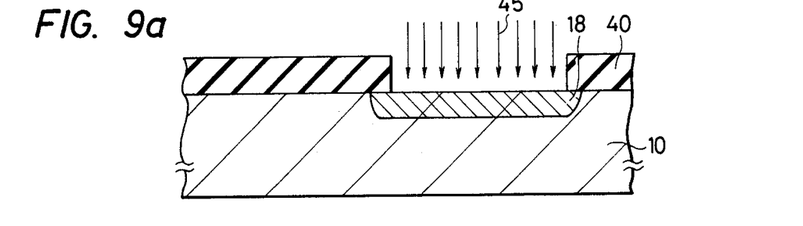
FIGS. 9a–9d, FIG. 10, FIGS. 11a–11b, FIGS. 12a–12b and FIGS. 13a–13c are sectional views of devices showing processes for fabricating the transistors of the present invention in the case of utilizing a two-dimensional electron gas.

An $SiO_2$ film 40 having a thickness of 5000 Å was evaporated on a semi-insulating GaAs substrate 10 by the use of the CVD process, and was subjected to selective chemical etching in order to form a drain region. Using the $SiO_2$ film as a mask, an Si ion beam 45 was injected at a dose of $2\times10^{13}$ cm$^{-2}$ under an acceleration voltage of 100 kV, to form the impurity region 18. In this regard, the ion implantation may be performed by selecting the acceleration voltage from within a range of 20 kV to 150 kV and the dose from within a range of $0.5\times10^{13}$ cm$^{-2}$ to $5\times10^{13}$ cm$^{-2}$. An $SiO_2$ film was evaporated on the whole surface to a thickness of 5000 Å by CVD, and annealing at 820° C. for 30 minutes was performed to activate the implanted Si atoms (FIG. 9a).

Figure 9B:
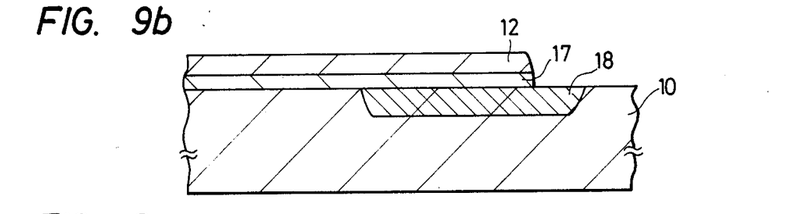

After the $SiO_2$ film was removed by chemical etching, a GaAs layer 17 was grown by 400 Å at a substrate temperature of 680° C. in a vacuum of $10^{-11}$ torr by the use of the molecular beam epitaxy (MBE) process. At that time, the layer was doped with Zn atoms as acceptors to attain an acceptor concentration of $3\times10^{17}$ cm$^{-3}$.

Next, an $Al_xGa_{1-x}As$ (x~0.3) layer 12 was grown by 500 Å. At this time, the layer was doped with Si atoms as donors to attain a donor concentration of $1\times10^{18}$ cm$^{-3}$.

Subsequently, the selective etching of the $Al_xGa_{1-x}As$ layer 12 and the p-type GaAs layer 17 for disposing a drain electrode on the drain region 18 was performed to expose a part of the layer of the drain region 18 (FIG. 9b).

Figure 9C:
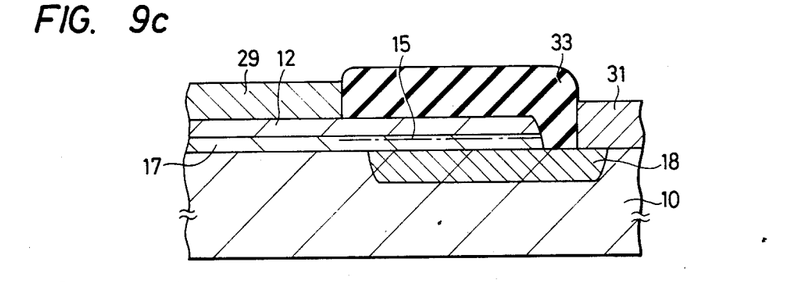

Subsequently, $SiO_2$ 33 being 3000 Å thick was evaporated by the CVD process and was selectively subjected to chemical etching, thereby to be windowed for source and drain electrodes. Thereafter, a source/drain metals [AuGe (1000 Å)-Ni (200 Å)-Au (1100 Å)] were evaporated (FIG. 9c). Thereafter, alloying was carried out at 450° C. for 3 minutes. Numeral 29 indicates the source electrode, and numeral 31 the drain electrode.

Figure 9D:
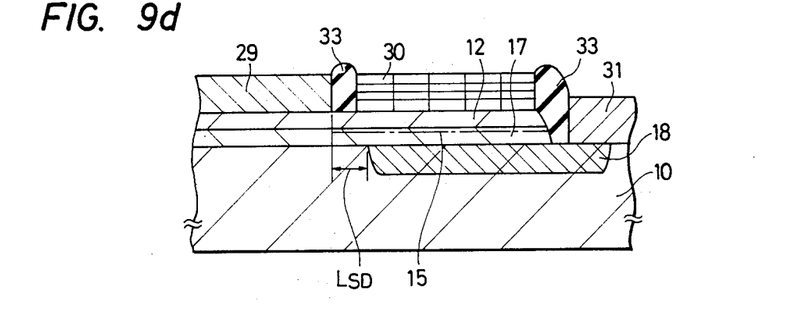

Here, it is important that the source electrode 29 and the drain region 18 are not short-circuited by the diffusion of AuGe. In the current case, the closest distance $L_{SD}$ between the source region and the drain region as indicated in FIG. 9d was about 1 μm. Next, the part of the $SiO_2$ over the drain region 18 was removed, and Ti (1000 Å)-Pt (200 Å)-Au (1000 Å) were evaporated to form a gate electrode 30. In the current case, a two-dimensional electron gas existed at the heterojunction interface of the interspatial part 33 between the source electrode 29 and the gate electrode 30, and this two-dimensional electron gas and the source electrode 29 lay in ohmic contact.

In case of the present embodiment, owing to the use of the semi-insulating GaAs substrate, a restriction on the source-drain distance $L_{SD}$ is mitigated, and the p-type region 17 has its concentration lowered down to the order of $10^{15}$ cm$^{-3}$.

Since, in the present embodiment, the p-type region 17 was as thin as 400 Å, an operating speed which was about 4 times higher than that of a bipolar transistor having a base layer 1000 Å thick and substantially equal dimensions was attained.

EXAMPLE 2

Figure 10:
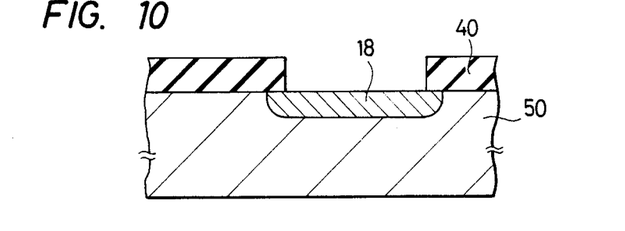

Shown in FIG. 10 is a case where the transistor of the present invention was performed on a p-type GaAs substrate containing Zn at a concentration of $5 \times 10^{17}$ cm$^{-3}$, instead of the semi-insulating GaAs substrate.

In order to form an n$^+$-type region 18 in the semiconductor substrate 50, the ion implantation process may be employed as in Example 1. However, the thermal diffusion of Si atoms may well be employed for the purpose of improving the crystallinity of epitaxial growth on the drain region 18.

The major reason therefor is that, when the layer 18 is formed by the ion implantation process, the crystallinity after the annealing worsens in some cases.

As p-type dopants, Be etc. are possible besides Zn.

Desirable as the n-type dopant of the buried layer 18 is an n-type dopant whose diffusion coefficient is as small as possible. In case of using the substrate 50 of the p-type, it is important for widening the margin of the transistor operation that depletion layers stretching from a source region and the drain region 18 are prevented from overlapping.

Excepting the selection of the semiconductor substrate, the semiconductor device was constructed likewise to Example 1.

EXAMPLE 3

Figure 11A:
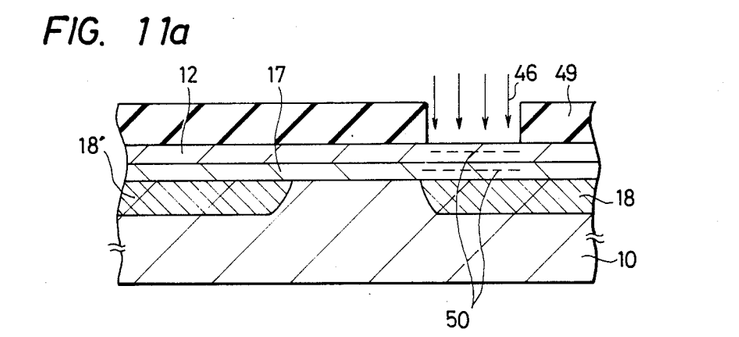
Figure 11B:
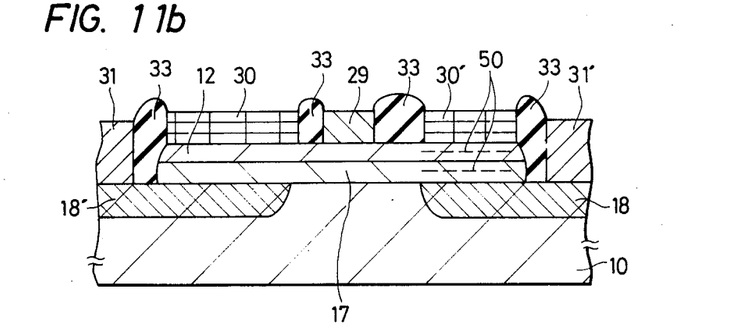

Shown in FIGS. 11a and 11b are examples of principal steps in the case where an E-type transistor and a D-type transistor are properly fabricated on an identical substrate. Drain regions 18, 18', a p-type GaAs layer 17 and an n-type Al$_x$Ga$_{1-x}$As layer 12 were formed at thicknesses and impurity concentrations similar to those in Example 1 in advance. Photoresist 49 being about 2 μm thick was windowed selectively in a part to dispose the gate electrode of the E-type transistor, and Be ions 46 were implanted (at 50) under the conditions of an acceleration voltage of 30 kV and a dose of $1 \times 10^{12}$ cm$^{-2}$ (FIG. 11a). After removing the photoresist, an SiO$_2$ film 3000 Å thick was evaporated by the plasma CVD process, and annealing at 800° C. for 30 minutes was performed to activate the Be atoms. Thereafter, drain electrodes 31, 31', a source electrode 29 and gate electrodes 30, 30' were formed via steps as in Example 1 (FIG. 11b). The E-type transistor is a portion having the gate electrode 30', and the D-type transistor is a portion having the gate electrode 30. Owing to the implantation (50) of the Be ions, the extent of the induction of two-dimensional carriers in this region is adjusted. Threshold potentials can also be adjusted by adjusting the impurity concentrations of the drain regions 18, 18'. That is, in the example of the ion implantation, the threshold value is also changed by changing the implantation energy and the dose.

EXAMPLE 4

Figure 12A:
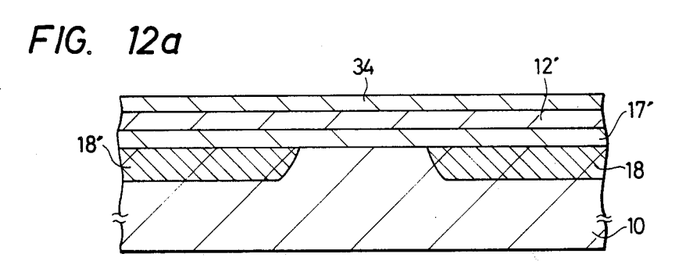
Figure 12B:
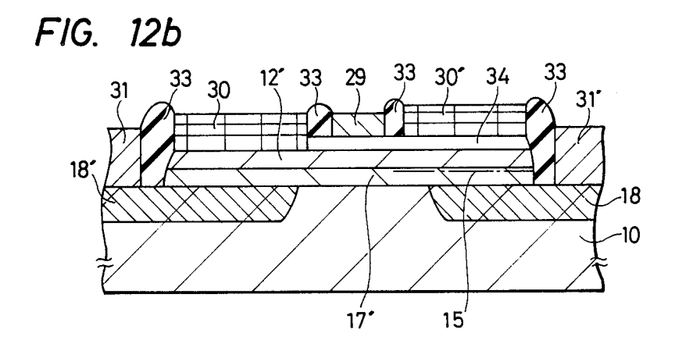

FIGS. 12a and 12b show an embodiment in the case where an E-type transistor and a D-type transistor are properly fabricated on an identical substrate.

Likewise to Example 1, drain regions 18, 18' were formed on a semi-insulating GaAs substrate 10. Subsequently, a GaAs layer 17' which contained Ge at an acceptor concentration of $5 \times 10^{17}$ cm$^{-3}$ and which was 500 Å thick formed by the MBE process. Next, an Al$_x$Ga$_{-x}$As (x·0.3) layer 12' containing Si at a concentration of $7 \times 10^{17}$ cm$^{-3}$ was grown by 400 Å, and a GaAs layer 34 containing Si at $10^{18}$ cm$^{-3}$ was grown by 200 Å (FIG. 12a).

Next, using a mixture gas consisting of CCl$_2$F$_2$ and He, the part of the GaAs layer 34 corresponding to the gate electrode of the E-type transistor was selectively removed by etching, whereupon gate electrodes 30, 30' were formed. The steps of forming a source electrode 29 and drain electrodes 31, 31' were the same as in Example 1 (FIG. 12b).

Numeral 33 designates an insulator layer. Since the distances between the gate electrodes 30, 30' and a channel (namely, the thicknesses of the layers) have a difference, the concentrations of carriers to be induced in the channel become unequal, and the E-type and D-type transistors can be realized.

EXAMPLE 5

Figure 13A:
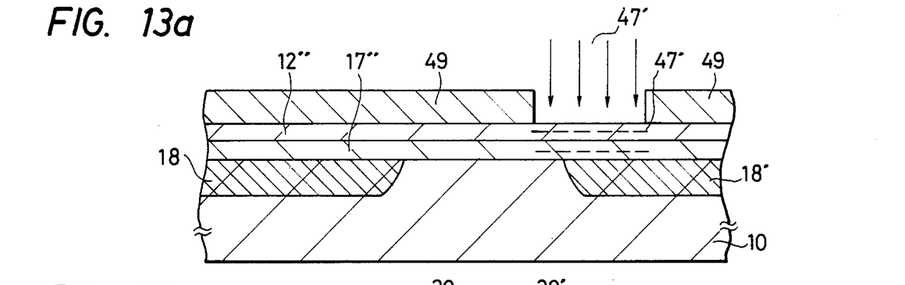
Figure 13B:
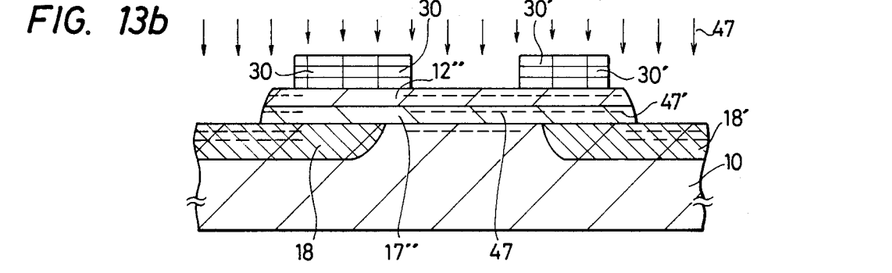
Figure 13C:
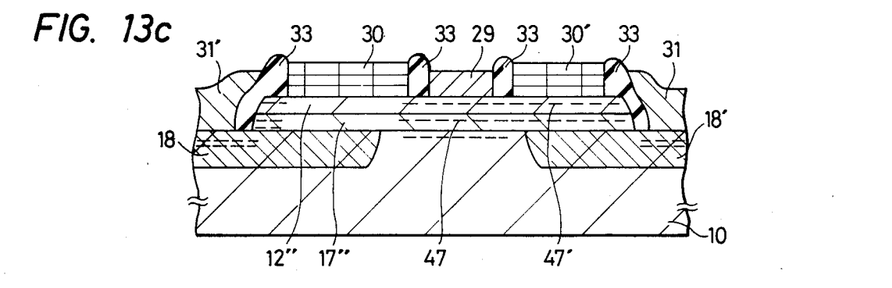

FIGS. 13a to 13c show examples of steps for fabricating an embodiment of the present invention being of the self-alignment type in such a manner that the E-type and the D-type are formed on an identical substrate.

Likewise to Example 1, n$^+$-type semiconductor layers 18, 18' were formed in a semi-insulating GaAs substrate 10 by the use of the ion implantation of Si. After annealing, a p-type GaAs layer 17" containing Zn at an acceptor impurity concentration of $5 \times 10^{16}$ cm$^{-3}$ was grown by 1000 Å by the use of the organic metal vapor evaporation process [OM-VPE process]. More specifically, the V/III ratio between (CH$_3$)$_3$Ga and AsH$_3$ was set at 15, and crystal growth was conducted at a substrate temperature of 700° C. Dimethyl zinc (CH$_3$)$_2$Zn was used as a p-type dopant.

Subsequently, an Al$_x$Ga$_{1-x}$As (x~0.3) layer 12" doped with Si at $5 \times 10^{17}$ cm$^{-3}$ was crystal-grown to a thickness of 600 Å by the O-VPE process employing AsH$_3$, (CH$_3$)$_3$Ga and (CH$_3$)$_3$Al. In order to dope the layer with the donors Si, SiH$_4$ gas was used. Next, in order to fabricate the D-type transistor, photoresist 49 being about 1.5 μm thick was deposited and was selectively windowed.

In the illustration, the photoresist is windowed in a part to form the gate electrode of the D-type. Using the resultant photoresist as a mask, Si ions 47' were implanted. Conditions for the implantation were an acceleration voltage of 30 kV and a dose of $1 \times 10^{12}$ cm$^{-2}$ (FIG. 13a).

Te, Se etc. heavier than Si are sometimes used as ion species.

A CVD SiO$_2$ film was deposited by 3000 Å, and was annealed at 750° C. for 20 minutes. Thereafter, in order to form drain electrodes, the n-type Al$_x$Ga$_{1-x}$As layer 12" and the p-type GaAs layer 17" were selectively removed by chemical etching (FIG. 13b). Subsequently, W silicide was deposited on the whole surface by 3000 Å by the use of a vacuum evaporator at $10^{-6}$ torr, and gate regions 30, 30' were formed in accordance with conventional processing methods. Next, using the gate electrodes as a mask, si ions 47 were implanted.

Conditions for the implantation were an acceleration voltage of 50 kV and a dose of $1 \times 10^{13}$ cm$^{-2}$.

Subsequently, SiO$_2$ 3000 Å thick was deposited on the whole surface by the CVD process, and it was annealed at 800° C. for 30 minutes. Subsequently, it was etched so as to leave an SiO$_2$ layer 33 for the isolation of electrodes, and a source electrode 29 and the drain electrodes 31, 31' were formed by the use of AuGe (1200 Å)-Ni (150 Å)- Au (1500 Å) (FIG. 13c).

In the current case, the transistor having the gate electrode 30 is of the E-type, and the transistor having the gate electrode 30' is of the D-type.

The present embodiment is characterized in that the D-type transistor is fabricated by the ion implantation process.

The reason why the ion implantation was conducted using the gate electrodes as a mask in order to form the source electrode as illustrated in FIG. 13b, is to establish ohmic contact with a two-dimensional electron gas layer at a heterojunction interface under the gate electrodes 30, 30'.

In the case of the present embodiment where the E-type transistor is previously formed, the n-type Al$_x$Ga$_{1-x}$As layer 12'' may well be replaced with a weak n-type Al$_x$Ga$_{1-x}$As layer which is not intentionally doped with any impurity.

EXAMPLE 6

Figure 14A:
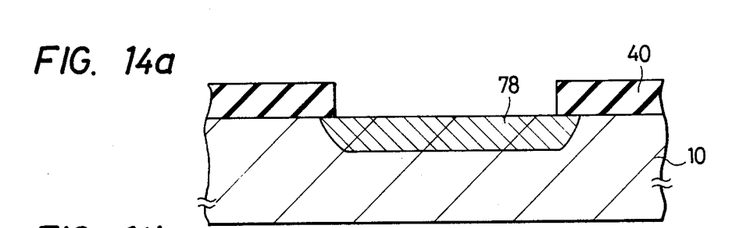
FIGS. 14a–14c are sectional views of a device in the case of utilizing two-dimensional positive holes.
Figure 14B:
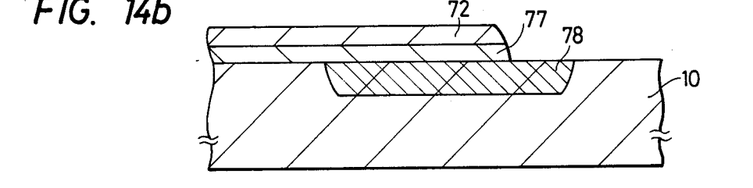
Figure 14C:
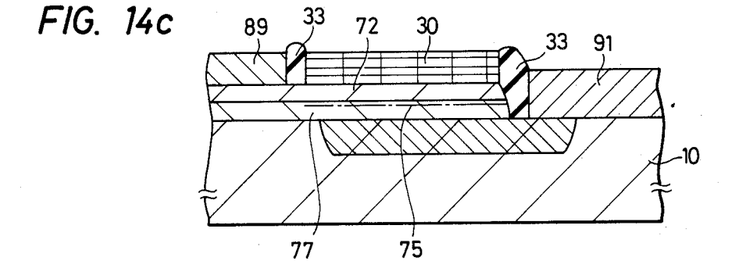

An embodiment in the case of employing two-dimensional positive holes as carriers is shown in FIGS. 14a to 14c. SiO$_2$ 40 of 4000 Å for forming a drain region 78 was deposited on a semi-insulating GaAs substrate 10 and was selectively windowed, whereupon the drain region 78 was formed using the thermal diffusion of Zn. For the thermal diffusion of Zn, diffusion sources As and Zn were placed in an ampoule, and the ampoule was vacuum-sealed. The degree of vacuum was $1 \times 10^{-6}$ Torr. Thereafter, the diffusion was carried out under the conditions of a diffusion temperature of 650° C. and a diffusion time of 30 minutes. Then, the wafer was taken out of the ampoule and was washed. Subsequently, a GaAs layer 77 containing Si at a concentration of $5 \times 10^{17}$ cm$^{-3}$ was crystal-grown by 800 Å by the use of the MBE process. Next, a GaP$_x$As$_{1-x}$ layer 72 containing Zn at $1 \times 10^{18}$ cm$^{-3}$ was crystal-grown by 600 Å by the use of the MBE process. Next, chemical etching for connecting a drain metal to the p-type GaAs layer 78 was performed (FIG. 14b). Subsequently, Au - Zn (99:1) were deposited by 1500 Å as the source/drain metal and were alloyed at 500° C. for 10 minutes, to form a source electrode 89 and a drain electrode 91. Next, a gate electrode 30 was formed by the use of Mo (1000 Å)-Al (2000 Å).

SiO$_2$ 33 forms spacer layers for isolating the electrodes. For a heterojunction which forms two-dimensional positive holes 75 to appear at the interface thereof, Ge may well be used in lieu of GaP$_x$As$_{1-x}$. More specifically, it is the important point of the present invention that the two-dimensional holes can be accumulated at the heterojunction interface. Even with a heterojunction other than that of the GaP$_x$As$_{1-x}$/GaAs or Ge/GaAs system, the transistor of the present invention can be constructed as long as the two-dimensional holes can be stored.

In Examples 1-6 described above, the isolation between the elements was performed by mesa etching. The depth of the etching was approximately 1500 Å-2000 Å, and caused no hindrance to planar structures. Of course, the isolation between elements can also be executed by the use of the ion implantation of oxygen atoms etc.

In all the above examples, the second and third semiconductor layers defined a homogenous junction. However, this is not always necessary, but a heterojunction may be used in some cases. For example, although Example 1 used GaAs as the third semiconductor, a semiconductor greater in the electron affinity than GaAs may well be used. In this case, even when a semiconductor smaller in the electron affinity than GaAs is used, the transistor of the present invention can be performed.

The important feature of the present invention consists in that two-dimensional electrons or holes stored on a heterojunction interface are caused to flow in a direction perpendicular to the heterojunction interface, thereby to provide a transistor from which a great current can be derived.

What is claimed is:

1. A semiconductor device comprising, at least, a three-layer structure in which a first semiconductor layer and a second semiconductor layer are arranged so as to define a heterojunction and in which the second semiconductor layer and a third semiconductor layer were arranged so as to define a junction, a source electrode which is connected with two-dimensional carriers which accumulate in the vicinity of the heterojunction interface, a drain electrode which is electrically connected to said two-dimensional carriers at the heterojunction only through a series connection path formed of said third semiconductor layer and the junction of the third semiconductor layer with the second semiconductor layer, and a gate electrode which is connected to said first semiconductor layer and which serves as control means for the two-dimensional carriers, wherein said third semiconductor layer is selectively formed in a semi-insulating substrate, wherein said semi-insulating substrate has an upper and lower surface, with the third semiconductor layer being formed in the upper surface, and wherein said source, drain and gate electrodes are all formed over the upper surface of said semi-insulating substrate.

2. A semiconductor device as defined in claim 1, wherein an electron affinity of said first semiconductor layer is smaller than that of said second semiconductor layer.

3. A semiconductor device as defined in claim 2, wherein said first semiconductor layer is an n-type semiconductor layer or a semiconductor layer which is not intentionally doped with any impurity (not higher than a concentration of $10^{15}$ cm$^{-3}$), said second semiconductor layer is a p-type semiconductor layer or a semiconductor layer which is not intentionallydoped with any impurity (not higher than a concentration of 10hu 15 cm$^{-3}$), and said third semiconductor layer is an n-type semiconductor layer.

4. A semiconductor device as defined in claim 1, wherein a sum of values for an electron affinity and band gap of said first semiconductor layer is greater than a sum of values for an electron affinity and band gap of said second semiconductor layer.

5. A semiconductor device as defined in claim 4, wherein said first semiconductor layer is of the p-type or is not intentionallydoped with any impurity, said second semiconductor layer is of the n-type or is not intentionally doped with any impurity, and said third semiconductor layer is of the p-type.

6. A semiconductor device as defined in claim 1, wherein said third semiconductor layer is electively formed in a semiconductor substrate which has the same conductivity type as that of said second semiconductor layer.

7. A semiconductor device according to claim 3, wherein said first semiconductor layer is formed of $Al_xGa_{1-x}As$ (where $x \sim 0.3$ and said second semiconductor layer is GaAs.

8. A semiconductor device according to claim 3, wherein said third semiconductor layer is formed of GaAs.

9. A semiconductor device comprising, at least, a three-layer structure in which a first semiconductor layer and a second semiconductor layer are arranged so as to define a heterojunction and in which the second semiconductor layer and a third semiconductor layer are arranged so as to define a junction, a source electrode which is connected with two-dimensional carriers which accumulate in the vicinity of the heterojunction interface, a drain electrode which is electrically connected to said two-dimensional carriers at the heterojunction only through a series connection path formed of said third semiconductor layer and the junction of the third semiconductor layer with a second semiconductor layer, and a gate electrode which iRs connected to said first semiconductor layer and which serves as control means for the two-dimensional carriers, wherein said third semiconductor layer is selectively formed in a semi-insulating substrate, wherein said semi-insulating substrate has an upper and lower surface, with the third semiconductor layer being formed in the upper surface, wherein said first and second semiconductor layers are stacked on top of said third semiconductor layer, and wherein said source, drain and gate electrodes are all formed over the upper surface of said semi-insulating substrate.

* * * * *